US 6,625,797 B1

(12) United States Patent
Edwards et al.

(10) Patent No.: US 6,625,797 B1
(45) Date of Patent: Sep. 23, 2003

(54) MEANS AND METHOD FOR COMPILING HIGH LEVEL SOFTWARE LANGUAGES INTO ALGORITHMICALLY EQUIVALENT HARDWARE REPRESENTATIONS

(75) Inventors: Stephen G. Edwards, Woodbine, MD (US); Jonathan Craig Harris, Crofton, MD (US); James E. Jensen, Ellicott City, MD (US); Andreas Benno Kollegger, Baltimore, MD (US); Ian David Miller, Charlotte, NC (US); Christopher Robert Sunderland Schanck, Ellicott City, MD (US); Donald J. Davis, Ellicott City, MD (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/501,319

(22) Filed: Feb. 10, 2000

(51) Int. Cl.[7] ............................................... G06F 17/50
(52) U.S. Cl. ................... 716/18; 716/4; 716/1; 716/6; 716/16; 702/85; 702/108; 702/125
(58) Field of Search .................. 716/1–18; 702/85, 702/108, 125

(56) References Cited

U.S. PATENT DOCUMENTS

| | | | | |
|---|---|---|---|---|
| 4,570,217 A | * | 2/1986 | Allen et al. ................... 364/188 |
| 5,251,290 A | * | 10/1993 | Pabon ........................... 395/120 |
| 5,550,489 A | * | 8/1996 | Raab ............................. 326/93 |
| 5,706,205 A | | 1/1998 | Masuda et al. | |
| 5,801,958 A | | 9/1998 | Dangelo et al. | |
| 5,831,864 A | * | 11/1998 | Raghunathan et al. ...... 364/488 |
| 5,937,184 A | * | 8/1999 | Rao ........................ 395/500.41 |
| 5,966,534 A | | 10/1999 | Cooke et al. | |
| 6,064,819 A | * | 5/2000 | Franssen et al. ............. 395/709 |
| 6,219,628 B1 | * | 4/2001 | Kodosky et al. ................ 703/2 |
| 6,272,559 B1 | * | 8/2001 | Jones et al. .................. 709/530 |
| 6,278,386 B1 | * | 8/2001 | Hogan .......................... 341/58 |

FOREIGN PATENT DOCUMENTS

| | | | |
|---|---|---|---|
| EP | 0 829 812 A2 | 3/1998 | |
| JP | 2000-267693 | * 9/2000 | ........... G10L/15/18 |

OTHER PUBLICATIONS

EDN Electrical Design News; "System–Level Design Languages: to C or not to C?"; Cahners Publishing Co., Newton, Massachusetts; vol. 44, No. 21; Oct. 14, 1999; pp. 135–136, 138, 140, 142, 144, 146.
Reinaldo A. Bergamaschi; "Behavioral Network Graph Unifying the Domains of High–Level and Logic Synthesis"; Proceedings of the 1999 Design Automation Conference., 36th DAC,; Jun. 21–25, 1999; pp. 213–218.

* cited by examiner

Primary Examiner—Matthew Smith
Assistant Examiner—Granvill D Lee, Jr.
(74) Attorney, Agent, or Firm—Venable, Baetjer, Howard & Civiletti; LeRoy D. Maunu

(57) ABSTRACT

The compilation of a high-level software-based description of an algorithm into efficient digital hardware implementation(s) is addressed. This is done through the definition of new semantics for software constructs with respect to hardware implementations. This approach allows a designer to work at a high level of abstraction, while the semantic model can be used to infer the resulting hardware implementation. These semantics are interpreted through the use of a compilation tool that analyzes the software description to generate a control and data flow graph. This graph is then the intermediate format used for optimizations, transformations and annotations. The resulting graph is then translated to either a register transfer level or a netlist-level description of the hardware implementation.

45 Claims, 4 Drawing Sheets

MEANS AND METHOD FOR COMPILING HIGH LEVEL SOFTWARE LANGUAGES INTO ALGORITHMICALLY EQUIVALENT HARDWARE REPRESENTATIONS

FIELD OF THE INVENTION

The present invention relates generally to electronic design automation and computer-aided hardware design. In particular, it is a computer-based technique for compiling functional algorithmic descriptions written in a high-level software language into digital hardware implementations.

BACKGROUND OF THE INVENTION

Current digital hardware design is done using hardware description languages (HDLs) such as Verilog and VHDL. These languages provide special constructs to handle the description of digital hardware-specific entities such as registers and clocks. While these languages are effective in describing hardware circuits they provide little in the way of high level abstractions to manage the complexity of modern designs. In contrast, modern software languages, and in particular object-oriented software languages such as Java and C++ provide robust high-level constructs that are very effective at managing complexity and serve to improve designer productivity as well as design quality.

In order for designers to keep pace with the amount of resources available in digital integrated circuits, designers must be prepared to double their productivity every 18 months. This is because the amount of available silicon doubles every 18 months. Current approaches to improving designer productivity using HDLs have had only limited success. The key to overcoming this challenge is to leverage high-level software languages for the design of hardware. However, a number of obstacles are readily apparent. Software languages were not designed for the description of hardware, and as such have no constructs for handling hardware specific structures. In addition, the underlying assumptions inherent in a software program (sequential execution, availability of a stack and heap) are not necessarily valid or desirable in a hardware implementation.

These challenges have, in the past, largely been addressed by either working to extend current HDLs to provide higher level construct or by adding features to a high-level software language to describe hardware specific constructs. However, neither approach has resulted in acceptable results. Extending an HDL is simply a stop-gap measure that cannot scale and does not solve the problem for the long term. Adding features to an existing software language to describe hardware seems like a reasonable approach, but what then happens is that the higher level of abstraction is lost, and the language simply turns into another syntax that implements the same HDL semantics.

SUMMARY OF THE INVENTION

The invention addresses the compilation of a high-level software-based description of an algorithm into efficient digital hardware implementation(s). This is done through the definition of new semantics for software constructs with respect to hardware implementations. This approach allows a designer to work at a high level of abstraction while the semantic model can be used to infer the resulting hardware implementation. These semantics are interpreted through the use of a compilation tool that analyzes the software description to generate a control and data flow graph. This graph is then the intermediate format used for optimizations, transformations and annotations. The resulting graph is then translated to either a register transfer level or a netlist-level description of the hardware implementation.

BRIEF DESCRIPTION OF THE DRAWINGS

Embodiments of the invention will now be described in greater detail in conjunction with the drawings, in which.

DETAILED DESCRIPTION OF THE INVENTION

High level languages, such as Java, C, and C++, provide a means of rapidly capturing the functionality or behavior of an algorithm; a significant improvement over traditional Hardware Description Languages (HDL's) such as Verilog and VHDL which mix the functionality of an algorithm with its implementation. However, Java, C and C++ are software languages and have traditionally been targeted for execution on a variety of microprocessor architectures.

Figure 1:
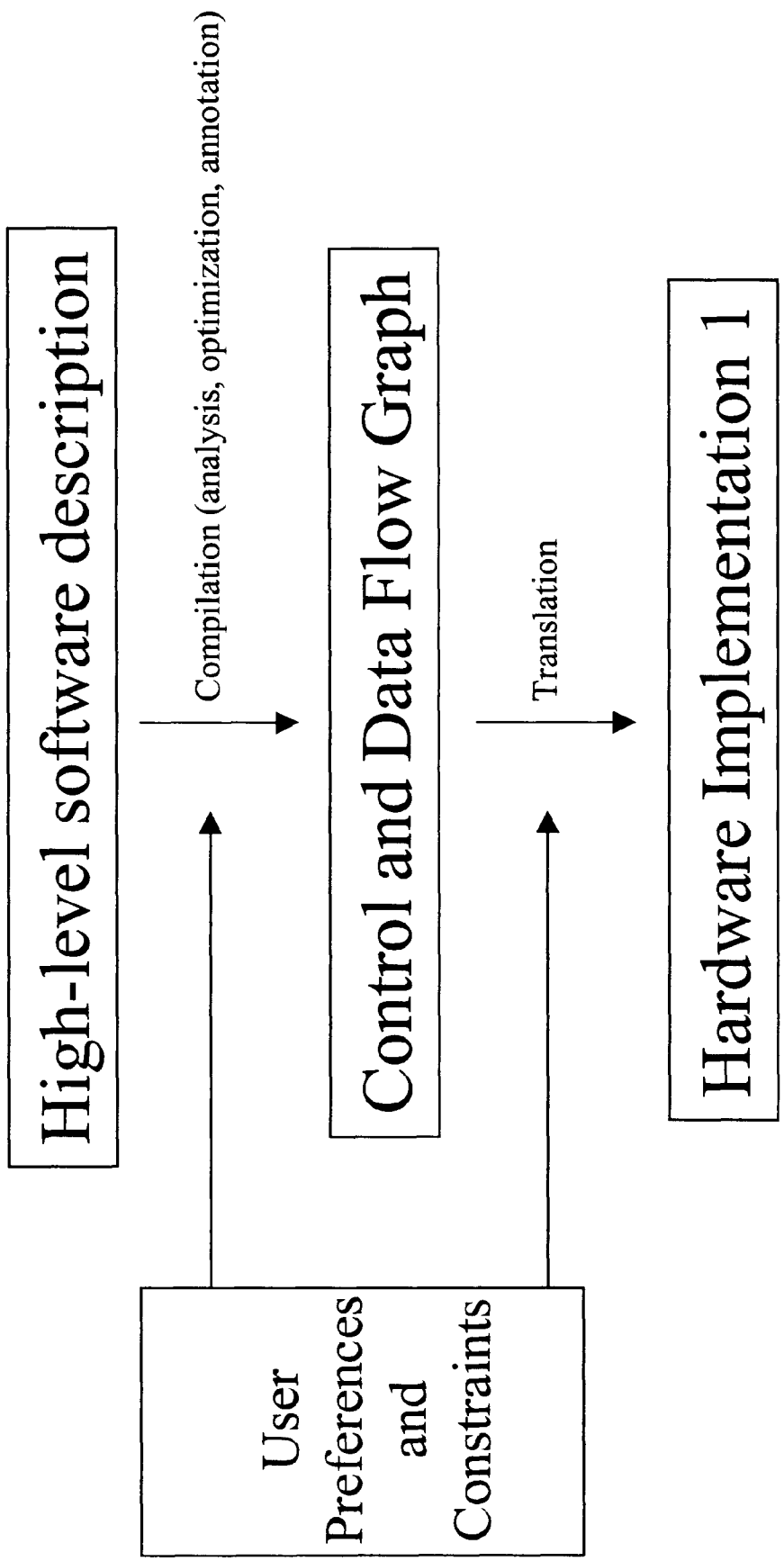
FIG. 1 shows the overall design flow using the invention.

FIG. 1 depicts the overall hardware design flow according to the present invention, which provides a means and method of analyzing the high-level source specification or a compiled (machine code or bytecode) representation of an algorithm and generating functional hardware implementations. In an alternative embodiment, a compiled version of the source code (machine code or bytecode listing) may be analyzed to generate a functional hardware implementation. The process of compiling source code (i.e., a high-level software description) to hardware implementations involves the creation of an intermediate representation of the algorithm that is independent (to the extent possible) of all microprocessor and hardware implementation elements. This representation details the relationships between the mathematical operations (arithmetic and Boolean) necessary to correctly implement the specified algorithm. The representation contains information describing each operation that must be performed, the order in which such operations must be performed, and any dependencies within the control or data flows. This information is represented without reference to microprocessor architectures, physical memory implementations or hardware implementations. The structure used to capture this independent representation is a Control and Data Flow Graph (CDFG) containing nodes (representations of the mathematical operations) and paths (logical directed relationships between nodes).

More specifically, there are two types of paths that exist in the flowgraph. The first represents sequential ordering of the nodes. These are defined as the control paths. The flowgraph will have at least one control path which connects one node to the next, mapping the order in which the mathematical operations are to occur. Control paths may split (fork) to indicate alternative paths (one or the other may be taken, but not both) (conditional operations), or may split (fork) to indicate parallel simultaneous paths to be taken (parallel operations).

The second type of path in a flowgraph is a data path. These paths indicate the relationships between data producers (those mathematical operations which create a data result) and data consumers (those operations which take in and operate on a data value). No operation that consumes data values may be evaluated until all data it consumes have been provided. Therefore, data paths can only connect from one node to another node that is reachable by traversing the control paths forward.

Nodes in the flowgraph take in data and/or control paths and produce zero or more output data paths and one or more control output paths. Every node takes in at least one control path to indicate that its function should be performed. If that function requires input data, a true value on the input control path indicates that all data paths represent valid data to be processed (an indication that all operations which precede this node to produce it's input data values have been successfully completed). Each node, additionally, produces at least one control output path to indicate that the function it performs has been successfully completed. In the case of a node that implements a conditional operation, this control output may indicate either a true compare or a false compare, but indicates successful completion in either case. A conditional operation node may generate multiple control path outputs each indicating different result conditions, but at least one must assert a true value upon completion of the function.

In addition to specifying the particular function to be implemented, nodes may be annotated with supplementary information concerning particular conditions to be met when generating a hardware implementation. For example, these annotations may include, but are not limited to: latency (number of clock cycles to complete), gate depth (combinational logic depth), speed (frequency of operation), meter (ability to be called multiple times before producing first result), area (number of logic gates to implement function), and throughput (bits per second). These annotations are used to guide the specific hardware implementations generated for the node. These annotations are generated by the invention through a series of refining optimizations and user specifications.

In constructing the flowgraph, nodes are created for each function specified in the source code specification, and connected via control paths according to their data dependencies and the order in which they are specified. Processing in the algorithm (acceptance of data to produce one or more results) is begun when data is applied to each of the data inputs to the algorithm, and the control path to the first node(s) is (are) asserted true. Processing then proceeds through each node in turn, or in multiple parallel nodes simultaneously (if control forked), until all control paths have re-joined at a control path output (corresponds to a data output) of the flowgraph. This operation paradigm has been dubbed "wavefront processing." The assertion of control paths continues from the beginning to the end of the flowgraph as a wave moving through the nodes.

The initial flowgraph (the flowgraph generated from the compiled source code specification with no optimizations or transformations applied) has a minimal sense of temporal operation. This means that when data and control are applied, they propagate through the flowgraph and reach a steady state, at which point the result is produced. In the event of looping structures, for example, the control will cycle through many times before producing the result. To represent functional hardware, cases such as these necessitate introduction of sequential hardware elements. These elements direct the propagation of control and data through the flowgraph to happen under the control of a system clock. This direction means that data and control will propagate through the flowgraph from one sequential operation to the next, and wait there for the next system clock event. Each sequential node in the flowgraph is under the direct control of one and only one clock. All nodes that are controlled by the same clock are said to be in the same clock domain. Though a node is controlled by only one clock (contained in only one clock domain), it may get its data values from nodes in any clock domain, and its produced data values may be used by nodes in any clock domain.

For the sake of convenience, several key terms are defined as follows:

Flowgraph—an abstract representation of the processes and data necessary to implement an algorithm, including nodes and paths.

Node—an element of a flowgraph representing an operation to be performed, or a data field to be used.

Control Path—an element of a flowgraph representing the sequence in which nodes are to be traversed to implement the specified algorithm.

Data Path—an element of a flowgraph representing the moving of data between nodes of the flowgraph.

Clock—a binary signal controlling the advancement of processing from one sequential element in the flowgraph to the next.

Clock Domain—the collection of nodes and paths whose operation is governed by the same clock.

The present invention is concerned with a means and method by which the semantics of a high-level source code specification are used to translate the source specification to a hardware implementation. The description here assumes a source specification in the Java software language, though the techniques and methods are applicable to any high level language. For simplicity, the terms bytecode and opcode may be used interchangeably throughout this specification; however, both are understood to mean the numerical representation of a specific function performed by a microprocessor.

Figure 2:
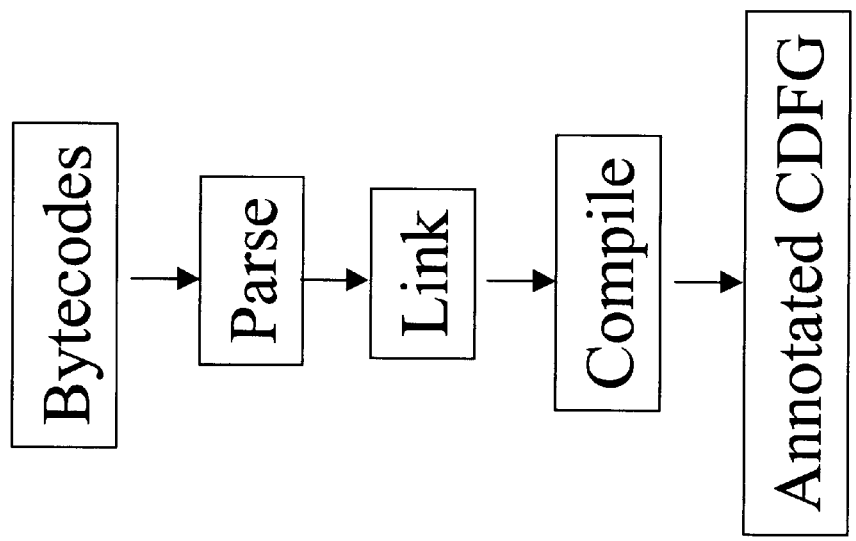
FIG. 2 shows the compilation process.
Figure 3:
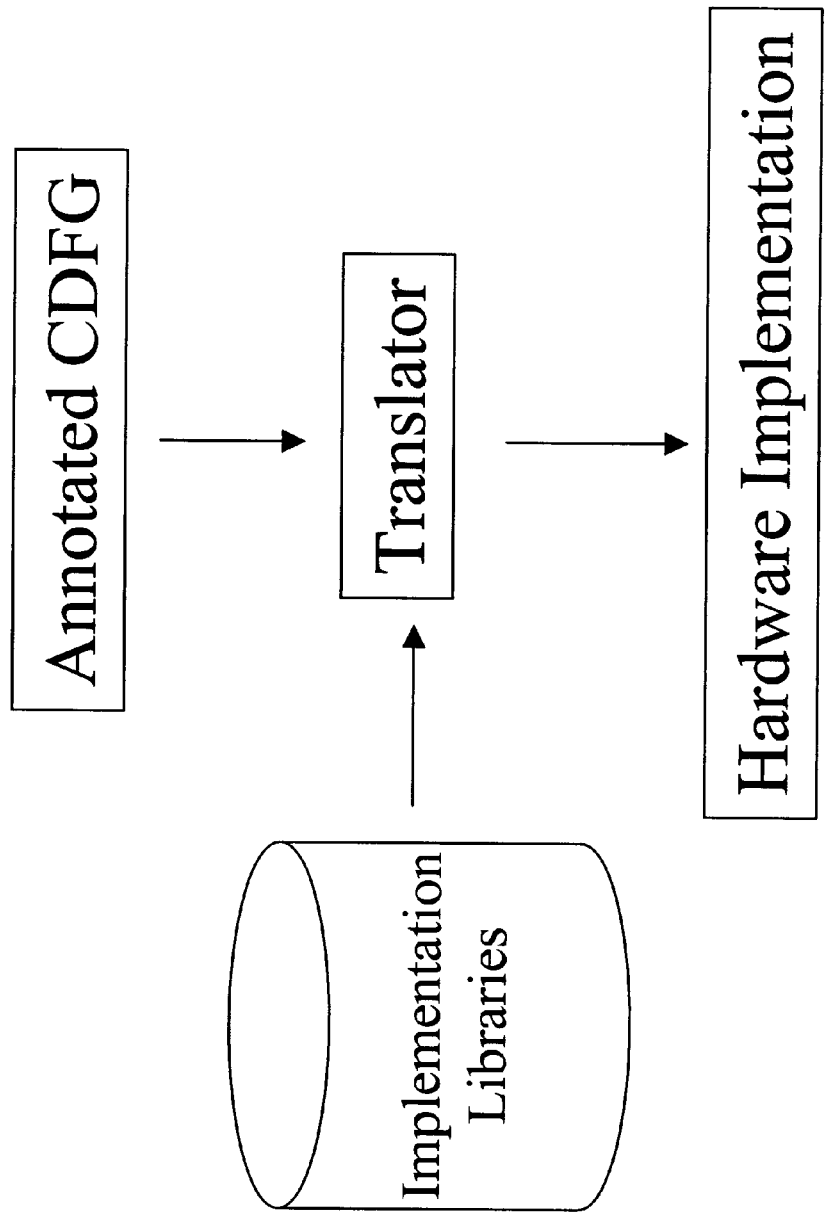
FIG. 3 shows the translation process.

In the present invention there are several steps taken in translating the high-level source code language into a hardware implementation. These steps are shown in FIGS. 2 and 3 and discussed below, and they are accomplished through the details provided in the sections that follow.

Parse

An initial directed graph representation is created based upon the sequence of bytecode instructions that comprise the method. This representation is independent of the target translation language and captures the identity and sequencing of the bytecode instructions.

Link

Method dependencies are resolved by locating the bodies of methods referenced by method invocation bytecode instructions. The calling hierarchy of methods is recursively parsed, linked, and compiled.

Unique copies of each called method are kept for each invocation so that local optimizations may be performed on them in context.

For all other bytecode instructions, gate level implementations are created that to meet the user specified performance characteristics.

The top-level method of the application identifies the I/O domain objects and methods that were defined by the user. It also identifies the non-I/O domain objects and methods. Physical I/O domain and logical domain objects and methods are identified in order to characterize the interface of the application logic with the external environment.

Compile

The directed flow graph is examined in order to find the points at which the control path loops back upon itself. These are called feedback points, and they indicate the need to maintain state in the source method.

Based upon the control flow and the definition of each bytecode instruction, the data flow between the bytecode instructions is derived based upon the manipulation by each instruction of the stack, the local variable space, the global variable space, and the heap.

Structural optimizations such as loop unrolling are applied where possible to remove extraneous states. Additional data path optimizations such as constant propagation and dead code elimination are applied to minimize logic.

In addition, the source specification is analyzed with respect to the thread model to create parallel control paths and synchronize the communication between these paths, provide protection for multiply accessed blocks, introduce power management circuits and annotate threads with priority for use during scheduling.

Nodes and flowgraphs are created for object management while exception paths and flowgraphs are created for exception management.

Given this information, the method flow graph is scheduled. Physical memory and routing elements such as registers, flip-flops, and multiplexers are inserted into the data flows in order to ensure their arrival times at each destination instruction, so that the functionality of the original source code is preserved. Additional memory elements may be inserted to achieve a pipelined representation that meets user performance constraints.

The control signals and supporting Boolean primitives for these elements are also inferred and connected appropriately.

As the method calling hierarchy is recursively resolved and compiled, external references are resolved and hierarchical routing is defined for method call arguments and return values, static class field accesses, and heap object accesses. Global memory elements are defined to support these accesses.

The interconnections between the physical I/O modules and the logical application modules are defined.

Translation

The fully resolved, elaborated and annotated logic design flow graph representation is translated into the target language (i.e., into a hardware representation) via library substitution, circuit generators, inline code, library references, etc., according to the annotations of each node and path.

These steps are accomplished by the present invention's core engine. The precise ordering of these steps may differ from the listing above and/or the steps may be applied iteratively. Each of the steps above either derives information from the source code specification (via the compiled bytecodes) or uses that information in the restructuring, annotation, or translation of the flowgraph. The information gathered from the bytecodes/source code is obtained through analysis of the language semantics and structure through the processes detailed in the rest of this specification.

Operation Inference from Byte Code Specification

The compiled bytecode representation of the algorithm is analyzed by the present invention to generate the nodes in the initial flowgraph. The bytecodes create a system of nodes in the initial flowgraph which do not, as yet, have paths connecting them.

Once the flowgraph is populated with the set of nodes (operations) necessary to implement the specified algorithm, the nodes must be connected by a series of control and data paths to complete the representation. These paths are created and connected by analyzing the sequence of bytecodes in the compiled source, and the action of each node with respect to control flow. In the present invention, this step happens concurrently with generating the nodes for the flowgraph.

Node Generation

In a typical microprocessor environment, algorithms are coded in a high-level source code (Java, C, C++, Pascal, etc.) and compiled to a sequence of bytecodes which are to be executed by a fixed resource processor. Each bytecode in the compiled program indicates a specific operation to be performed by the logical unit of a microprocessor. In the preferred embodiment, instead of indicating an operation to be performed on a fixed resource, each bytecode is now defined to cause the instantiation of a specific hardware circuit in the final hardware implementation. This is accomplished through a two step compilation-translation process.

The first step is the generation of the hardware-implementation independent flowgraph. Each bytecode in the compiled source language specifies a node to be inserted into the initial flowgraph. This node represents a distinct hardware circuit in the resulting hardware implementation. The node's characteristics are defined by the specification for the target microprocessor architecture which the original source code specification was compiled against. These characteristics include specific function (operation, data movement, etc.), number and type of data values consumed, and number and type of data values produced.

The second phase of the compilation-translation involves substitution of a hardware circuit for each node. The specific function implemented in each hardware circuit is specified by the semantics of the bytecode which created that node coupled with the flowgraph annotations that were derived from the user supplied constraints and preferences and optimization/transformations. The actual generation of the hardware to be substituted may via direct substitution, dynamic hardware generation, or library references. For dynamic hardware generation, each bytecode, instead of inferring the substitution of a hardware circuit, may invoke a subroutine within the translation phase. This subroutine is capable of generating a variety of hardware representations for each bytecode based on flow graph annotations. For library references, bytecodes would translate to references to library elements instead of inserting hardware circuits into the final implementation.

Data and Control Flow Inference from Stack Manipulations

In the process of generating hardware via the intermediate step of the more generalized, implementation-independent flowgraph structure, it is critically important to remove all of the artifacts that are introduced by traditional software code compilers. These artifacts are introduced because of the assumptions made by a software compiler with respect to the execution environment. These assumptions do not hold true for a hardware implementation and therefore, provide artificial constraints that, if they are not removed, lead to inefficient hardware generation. There are two common types of artifacts that must be removed in order to generate a minimally constrained flowgraph representing the algorithm.

Stack Removal

The first artifact that must be removed is all references to a "stack". The removal of the stack references from the compiled source is what creates the control and data paths in the initial flowgraph.

A "stack" is a Last In First Out (LIFO) persistent storage structure. Data is put into the stack memory by means of "push" operations. A push operation causes the current piece of data to be placed in the top memory location, and all data currently in the stack is forced to the next, (n+1)th, location. Data is retrieved by the reverse process (referred to as a "pop"), where the top data element is removed from the stack, and all remaining data moves up to the previous, (n−1)th, position.

A stack is widely used in microprocessor architectures for storing intermediate data results while the next operation to be performed is retrieved from the bytecode sequence. Similarly, entire data structures may be pushed onto a stack in order to be passed from one routine to the next. The necessity of the stack in a microprocessor, is a result of the limited, shared processing resources (ALU and data registers). In an application-specific hardware design, these limitations are no longer imposed on the architecture, as data paths can be created that directly connect processing elements, obviating the need for a stack.

In the present invention, stack removal, or translation of stack accesses to individualized data flows, is accomplished through two steps. The first step entails detailing the logical or control flow of the algorithm. This information is extracted by analyzing the bytecode sequence in each method (subroutine). This process begins at the entry point to the program, typically a "main" routine. Once the entry point to the algorithm is determined, the control flow proceeds from one bytecode to the next in sequential order. The nodes, which correspond to operations, are connected via control paths indicating partial ordering of the operations. In cases where a control path fork is indicated in the bytecode sequence, as a combination of a conditional operation with a "jump" offset, one node (the fork) will have two control outputs driving two distinct nodes, thus creating two parallel control paths in the flowgraph. In the case of a conditional fork, one branch will represent the bytecodes that would be executed on a "true" result, the other branch represents the bytecodes which would be executed on a "false" return from the conditional operation. This initial flowgraph now specifies the operations and the sequencing necessary to accomplish the specified algorithm, but still depends on a stack to move data between the sequenced operations.

The second step is to remove all references to the stack. The Java bytecode set includes several "pop" operations that indicate that a data value is to be taken off the stack for use by an operation. Additionally, the specification states that many of the operations infer one or more pop operations. Similarly, many operations automatically "push" their results onto the stack. To remove the stack references, the initial (control connections between nodes only) flowgraph is traversed, beginning at the entry point to the algorithm. As each node is reached, its behavior, with respect to the stack, is analyzed. Each "push" operation, or implied push, is understood to place a value on the stack, and thus generates a data output, or result, for that node. Each time an operation "pops" a value off the stack a data connection is made between the data output of the operation which had pushed that value onto the stack, and the operation which is retrieving it. This process continues until all stack references have been removed. Thus, in the present invention, this process of adding control and data paths between the nodes of the flowgraph) is accomplished through analyzing the push and pop (explicit or implied) operations on the stack structure of the target microprocessor architecture. The push/pop operations each correlate directly to a data path in the flowgraph.

In an alternative embodiment of the present invention, a subsequent improvement pass is made on the flowgraph(s) to the control and data paths. This improvement has the effect of "parallelizing" the nodes with respect to data flow. Each node is analyzed in turn. If the node is a conditional node, (multiple control outputs) it is ignored. At each of the other nodes, the control output ("Done") is analyzed. If a target of that control signal does not consume data from the current node, then the target node has this control signal removed. The input control signal of the current node is then factored into that target nodes control input. Thus, the two nodes (which have no direct data dependency) now execute in parallel (concurrently). This process continues until all nodes have been fully resolved to be executed exactly when their data has been produced (and conditionally on any decisions which factor into that node's execution by conditional nodes).

Constant Pool Removal

The second artifact of modem microprocessors that must be removed comprises references to a "constant pool." The constant pool is a listing of constant values used in he processing of the algorithm. When a constant is needed during operation, a bytecode retrieves the value at a particular offset into the constant pool, and pushes it onto the stack for subsequent use by an operation.

In the present invention, constant value expressions in the source language correlate directly to specific bytecodes instructions (e.g. 1dc, 1dc_w, 1dc2_w). As the flowgraph is being constructed, these bytecodes are detected. Once the data connections have been established, via stack removal, nodes which access the constant pool are re-visited and removed from the flowgraph. Their control paths are re-connected such that the node(s) that immediately preceded the constant pool access now immediately precedes the node(s) that immediately followed the constant pool access. The data output of the constant pool access node is replaced with an annotation which indicates that the resulting hardware, generated from the flowgraph, should have a constant value applied to the inputs of the listening node(s). In some implementations, this may translate to direct connections to power (Vcc) or ground (reference). In an alternative embodiment, the substitution of constant values for constant pool accesses may occur during control flow analysis or stack removal.

Optimizing the Control/data Flowgraph

Following the generation of an architecture independent flowgraph, a series of algorithms may be applied to each flowgraph and to the collection of flowgraphs with the intention of further refining the structures created to generate more optimal hardware structures. These "optimization" passes implement features including logic reduction (removal of redundant Boolean or sequential logic, translation of logic to simpler structures, removal of code which is never executed), scheduling (insertion of sequential elements to improve/reduce combinational delays), resource sharing, logic parallelization (inferring parallel operations from data dependencies), control logic reduction, and the like.

Logic Reduction

The logic reduction optimization pass implements algorithms for reducing Boolean operations to simpler forms. This pass begins by analyzing each node in the flowgraph in turn for constant valued inputs, redundant (duplicated) inputs, or a simpler implementation. In the case of constant valued inputs, well-known Boolean reduction techniques are used to reduce the node to its simplest form. In the case of an AND gate with a constant 1 on one input, for example, the node reduces to a wire. Redundant or duplicated inputs allow reduction of Boolean gates (AND, OR, XOR) to wires or constants. Nodes that implement higher functions, adders and subtractors for example, can be reduced to constant shifts or other similarly simpler functions. Once the inputs of a node are analyzed, it is analyzed in context for further simplification. Cascaded adders may be simplified to a single adder with carry in, for example. Finally, the flowgraph is analyzed by looking for repeated logic structures. These structures may then be reduced to a single implementation if their inputs are functionally equivalent, or may be shared by multiplexing their inputs and distributing their outputs (see resource sharing below). Additionally, any logic whose outputs are never used (control or data) is removed.

Scheduling and Resource Sharing

The source code specification contains one or more constructs that indicate a recurring execution of a specific subset of functionality. These constructs include looping structures, such as "for loops", "while loops", and "do-while loops". In the target microprocessor architecture, a loop is created by causing the program counter to jump back up the instruction sequence a fixed number of instructions. In the bytecode representation this is represented by a branch instruction with the appropriate offset(s) encoded (a backward branch).

In the present invention, these source code and/or bytecode structures are used to directly infer the use of sequential hardware elements (flip-flops or registers) for any variable whose value is assigned by one or more instructions within the "loop" instruction subset. The use of these sequential elements is mandated by the restriction that any looping structure implemented in hardware must, by necessity, take a discrete amount of time per iteration, generally defined by an edge of a clock signal. This eliminates asynchronous feedback loops with undefined completion states. Each variable that is assigned a state within the looping structure must be able to maintain that state between iterations of the loop and thus must be implemented in sequential elements (registers). In a similar manner, the source/byte code specification indicating looping structures, by necessity, infers a sequential element to be placed in the control path. This flip-flop allows for the loop to execute on specified intervals (clock edges) and to maintain state between those intervals.

Once this initial scheduling has been done, one or more scheduling passes may be employed to improve performance or to meet certain speed and/or latency goals. These scheduling passes are capable of inserting registers (sequential elements) into the flowgraph while still maintaining correct functionality. This is accomplished by associating the control flow with the data as it moves through the flowgraph. Each time a register is inserted between two nodes in the flowgraph, the control signal between those same two nodes (indicating the completion of the first, and the activation of the second) is broken and a flip-flop inserted. This has the effect of delaying the control by the same number of cycles as the data.

An additional scheduling pass may be run on the flowgraph(s) which define the current design. This pass analyzes the control path for redundant or parallel logic. By identifying these parallel paths in the control, the control structures for the design may be reduced to their optimal form, a single control path originating from each output of each conditional node in the flowgraph. Each of these control paths may contain zero or more flip-flops to indicate the number of sequential registers found in the data path between the control's driver (conditional node), and the next conditional (or termination of the flowgraph). These control paths are then responsible for enabling the sequential elements in their scope. The control paths through the combinational elements are removed as they are no longer necessary.

Now that the initial flowgraph has been created and all control and data paths have been instantiated, there are several layers of refinement of the flowgraph that may be implemented to improve the quality of the hardware produced. Each of these refinements takes knowledge gleaned from the source code specification (by way of the compiled bytecodes) to improve the quality of the hardware and overall system of the final implementation.

In the Java programming language, there are several keywords and concepts that are used in this refinement process. Each of these keywords/concepts is detected in the specification and is used to annotate the flowgraph with additional implementation details or is used to adjust the structure of the flowgraph.

Determination of Hardware Precision by Analysis of Data Types

One of the advantages of custom designed hardware solutions is the ability to specify the exact precision necessary to represent inputs, outputs, and all intermediate results. This eliminates any extraneous hardware for processing significant digits that will not affect the results. In contrast, modem microprocessors typically perform all calculations with 32 bit numbers, even if the calculation requires only four bits. The present invention uses software languages to specify hardware implementations and as such does not explicitly specify the optimal sizes for operations. However, this invention describes a number of means by which the necessary precision for an operation can be implicitly determined from the source specification of an algorithm before translating the flowgraph to a hardware implementation.

Node precision reduction based on source code data types

The first of these methods defines the initial precision of all data paths and nodes in the algorithm. In the preferred embodiment, each operation is defined by a bytecode in the Java language. The Java language is a strongly typed language, meaning each operation and data value has a specified precision and set range of possible values. In the flowgraph all data paths are initially specified and annotated with a precision of 64 bits, the maximum precision allowable in the Java Virtual Machine (though in alternative embodiments this precision may be a different value depending on the maximum precision of data in the target microprocessor architecture). By recognizing the precision defined in the specification for each operation, the data connections between nodes and the node implementations in the flowgraph can be sized accordingly. This also allows the hardware implementation selected for each node in the flowgraph to be sized to the corresponding precision, thus reducing the size of the resulting hardware implementation. In a similar fashion, data values which are passed between flowgraphs (as in the case of parameters passed to a method/subroutine through the method/subroutine call or return values) are similarly strongly typed and sized in the flowgraph.

For example, consider a method that takes one parameter as type "byte". Any logic in the method that uses that value as input will have its corresponding data input sized to eight bits (the precision of the type "byte" in Java). This generation of precision data occurs for all data types specified in the source language, and there is a direct correlation of data types specified for variables and the precision information used in the generation of a hardware implementation. Table 1 shows the correlation of data types to precision specifications in the preferred embodiment.

TABLE 1

| | |
|---|---|
| byte | 8 bits |
| short | 16 bits |
| int | 32 bits |
| long | 64 bits |

Many of today's microprocessors implement reduced precision arithmetic on the same logic as full precision operations. For example, in the Java specification, data types are defined with 8-, 16-, and 32-bit precision. However, in underlying implementations of the Java Virtual Machine, all operations are performed with 32- (or 64-) bit precision, and the results are truncated. In the present invention, all nodes are annotated with the exact precision necessary to implement the specified data type, before translation to a specific hardware implementation. Thus, the data type keywords are detected in the source specification and are used to annotate each node's data path inputs and outputs with a specific precision.

Node precision reduction by arithmetic analysis

The second method used to refine the necessary data precision in the flowgraph is to analyze the use of constant values (either accesses to the constant pool or opcodes that infer a constant value) in the source specification with specific operations. These operations include the Boolean operations AND and OR, as well as shifting operations (shift left and signed/unsigned shift right). Whenever an input to one of these operations is set to a constant value, additional information about the precision of the operations that supply data to and receive data from that operation can be gleaned.

In the case of AND and OR Boolean functions, the constant value serves to mask (force result to a predetermined value) certain bits of the input. By analysis, it can be determined that the node supplying an AND gate's non-constant input needs to produce only a three-bit result (least significant 3 bits). This is determined from knowledge of the AND function. By definition, any single binary bit logically AND'ed with a 0 (false) value is guaranteed to be 0 (false). By this definition, any bits in the previous result that are to be ANDed with a 0 in the constant are insignificant (their values may be predetermined). This allows the node feeding the non-constant input of the AND gate to be annotated with a new precision of 3 bits wide (at the result). A similar analysis is performed for a Boolean OR function using the principle that any bit ORed with a constant 1 (true) is guaranteed to be 1 (true). Changing the AND gate in the previous example to an OR gate and using a constant value of 0xFFFFFFFFFFFFFFF8 (−8 signed decimal) would generate the same information (3-bit precision) about the driving node.

In addition to the Boolean operations, logical shifting of a value by a constant amount allows for analysis to determine a reduced precision on nodes. Logical shifting (multiplying or dividing a binary value by powers of 2) by a constant amount, while maintaining a fixed precision result, causes certain bits of the input to be discarded to produce the result. Thus, the correct result can still be exactly calculated from a reduced set of input bits. This information is annotated to the node supplying the non-constant data value, resulting in a node with reduced precision and, consequently, an improved hardware implementation. Take (in 32-bit precision logic), for example, a left shift by a constant amount of 4 (equivalent to multiplying the value by 16). An operation that provides the variable input (the value to be shifted) to the shift needs only produce a 28-bit result. This reduction of precision is created because it is known that the top four bits of the result will be discarded after a 4 bit left shift. Therefore, only the 28 least significant bits need to be produced.

These two means of reducing the precision needed by the hardware implementation of this algorithm use Boolean operations such as AND, OR and shifts (left and right) in the source specification language in conjunction with constant values (accesses to the constant pool or constant opcodes) to infer the correct bit width.

Propagation of precision analysis

In both of the previous precision reduction methods one or more nodes were annotated with a precision (bit width) less than the default precision of the source code compiler's target microprocessor architecture. Once this information has been determined, and annotated, it can be propagated through the rest of the flowgraph by traversing the data path to and from each of these nodes. In the present invention, this process is performed by traversing the data paths through the flowgraph from all data inputs to the results and then in reverse (results to data inputs). As each node is encountered in the traversal, it is analyzed based on the function it performs and the annotated precision on its inputs and outputs. Take, for example, a node representing an add function, where both inputs are annotated with a 32-bit precision (the default) and the output is annotated with a 7-bit precision. In this case, it is known that to produce a 7-bit result from an add function, the maximum precision for both inputs is no greater than 7 bits each. This traversal continues from inputs to outputs, then vice versa, until all annotated precisions have been propagated throughout the flowgraph.

Analysis of Threads in the Source Language

The next refinement is accomplished by detecting accesses to the thread model in Java. These accesses take the shape of method calls and/or creation of new thread objects in the source code specification. These events are detected in the compiled source code and used to further refine the flowgraph.

Of primary importance in generating optimized hardware constructs to implement an algorithm is the creation of hardware structures that do as much processing as possible in parallel. True parallelism produces the result in the least number of clock cycles (an important measure of hardware performance). In a traditional microprocessor environment, process execution is limited to sequential operations by the architecture of the processor. To combat this limitation the concept of threads is used. Threads allow the illusion of concurrency through an automatic time-share mechanism or, if there are multiple processors, true coarse-grained concurrency.

In the present invention, the analysis of the thread model enables further refinement of the control/data flowgraph structure by specifying explicit coarse-grained concurrency. In the flowgraph all sequential nodes are grouped together under the control of the system clock, and execution proceeds from one sequential element to the next as directed by this clock. As threads are introduced into the algorithm specification, two things happen to the flowgraph.

Threads create multiple wavefronts

The first is the introduction of a control flow branch (thread branch) node. This node differs significantly from a conditional branch in the flowgraph. The conditional branch depends on the value of its data input(s) to produce a true (high) result on one of its control outputs. The thread branch instead takes in no data (in this embodiment, it may alternatively take in data to determine if the new thread should be spawned or to indicate the thread's priority) and produces a true result on one or more of its control outputs. Typically (and in this embodiment), the thread branch will have two control outputs. The first represents a continuation of the current thread (control path) wavefront processing. The second control output is the starting point of a new wavefront processing control path. The assertion of multiple control outputs (as in this case) will, potentially, result in a multiplication of the control wavefront. This is how the usage of threads in the source code specification explicitly creates parallelism in the resulting hardware implementation.

The second refinement of the flowgraph that occurs upon introduction of a thread into the algorithm is a potential division of the clock domains. Recall that in the ideal flowgraph, all sequential elements are grouped under (controlled by) a single system clock. The creation of a new thread indicates a new clock domain that contains all nodes created as a result of algorithm specification in that new thread. This new clock domain includes all nodes in the control path that was created at the thread branch node. A node is contained in this new clock domain if it can be reached by forward traversal of the flowgraph's control path, starting from the thread branch's "new clock domain" control output. A node can only be controlled by one clock domain. Note that the new clock domain control output of the thread branch may need to be synchronized according to the rules defined in the synchronization section below. This new domain may operate independently of any existing clock domains, and it may be specified as having a different, derivative, synchronous, gated, asynchronous or other system clock for control and propagation of the processing wavefront. The creation of a new clock domain in the flowgraph may translate to a final hardware implementation with multiple clocks in a single system. Thus, thread usage in the source code specification may also infer multiple clock sources for the final design implementation.

Inter-thread communication

The new wavefront of processing created at a thread branch will operate autonomously with respect to any existing wavefront(s) allowing multiple processes to occur simultaneously. This autonomy is maintained until "inter-thread" communication is attempted. In the specification language, this occurs when elements (objects for example) created in the domain of one thread are accessed by another thread. In the flowgraph, this is indicated by a control and/or data flow between two nodes in two different clock domains. In the source code specification, this is indicated by a method accessing a data field or method in an object that was created in another thread. In the preferred embodiment, the identification of nodes that are accessed by multiple clock domains is implemented by a simple traversal of the flowgraph's control path. In this example a starting point is defined as the "GO" of a flowgraph or any "new wavefront" output of a thread branch. Identification begins by traversing the flowgraph starting in turn at each of the identified starting points. The traversal's terminus points are defined as the DONE signal(s) of the flowgraph or any "new wavefront" control output of a thread branch (as these are starting points for additional traversals). As each node is encountered, traversal continues to any node reachable through any of its control outputs (with the exception of the "new wavefront" control output of a thread branch, which is a terminus for that traversal). Control feedback loops are broken by allowing analysis of each node only once per traversal. Any node that is reached on multiple traversals, indicating that a control path exists from a wavefront's start (the beginning of a thread/clock domain) to that node, is determined to be accessed from multiple clock domains. All such nodes and their accesses are catalogued for further analysis (described below under Synchronization).

Synchronization

When nodes that indicate cross-clock-domain control/data flow have been identified, the flowgraph must be modified to ensure that the operation of resultant hardware implementation corresponds to the source language specification. With the advent of thread branches (and with them additional clock domains) into the flowgraph, it becomes necessary to synchronize any data or control signal which crosses the boundaries between two of these clock domains. In the present invention source code method calls and/or data field accesses into objects by different threads lead to identification of a data or control flow across clock domain boundaries in the flowgraph. This causes a synchronization circuit to be inserted into the flowgraph. This circuit, in its general form, presents data from the source clock domain node (the node which is producing the data) to the data recipient (in the other clock domain) while guaranteeing the data validity. The data validity must be guaranteed during the recipients system clock cycle in which the data value is sampled. In the preferred embodiment, this circuit takes on the well-known form of a "double-flopped" synchronization circuit. That is, the data source is connected to a flip-flop type register (A) of the same bit-width. Register A captures the data on the rising (or falling, depending on specification) edge of the recipient clock domain. Register B has its data inputs connected to the (registered) data output of Register A. Register B similarly captures its value on the rising (falling) edge of the recipient clock domain. The data presented to the node in the receiving clock domain is obtained from the output of Register B. This circuit is commonly used to ensure valid data in multi-rate systems. It is understood that alternative circuits may be used in place of the synchronization circuit described here to produce the same result.

Synchronized keyword (monitorenter and monitorexit)

When cross-clock-domain flows are identified, steps must also be taken to ensure that any data fields are not concurrently modified and that execution of one wavefront proceeding through a subset of the flowgraph does not interfere with the execution of another wavefront. In the present invention these steps are handled in the source specification language through use of the synchronized keyword, and in the source compiled bytecodes through monitorenter and monitorexit In the present invention, these operations are used to identify areas of the flowgraph and data registers that must be protected from concurrent modification. In the preferred embodiment, this is accomplished through semaphore locks and priority coding the control sources into these blocks of code or data storage elements.

A block is defined as a sub-set of a flowgraph consisting of control and/or data flow connected nodes. These nodes may implement a variety of functions including (but not limited to) operations; be data storage; or be references to other flowgraphs. The block is defined as protected if, in the preferred embodiment, it begins (first node in the block reached through the control flow) with a monitorenter and terminates (last node reached through control flow before exiting the block) with a monitorexit. The protected block is modified in the flowgraph to ensure that the behavior of the resulting hardware corresponds to the behavior of the source control specification for that block. In the preferred embodiment, with Java as the source language, a synchronized method translates to a protected block. The flowgraph is analyzed to determine all data inputs into or outputs from the block. When multiple points of entry into a protected block exist, each control path entry into the protected block (each control source driving the GO) has a corresponding set of data sources (though these may overlap and/or be the same for all references to this block). The "GO" control and all data inputs to the protected block are modified to implement an access managing priority circuit. For every assertion of a control source to the block, the corresponding data sources are captured into data registers (see above for clarification on how data is synchronized among multiple clock domains). If no wavefronts are currently executing in the protected block, the control is asserted, and the captured data is driven to the appropriate data inputs. If the protected block is currently processing an event (a wavefront is within the block), then the control and data are held in the priority circuit until such time as the hardware resource becomes available. If multiple control sources attempt access of the protected block simultaneously, they are queued up in their respective registers and given access to the protected block in a predetermined order (round-robin, FIFO, LIFO, etc.). Similar to the means of capturing input control and data, a priority decoder is inserted on the data and control outputs to ensure the results and control flow return to the appropriate accessing clock domain. In an alternative embodiment, the protected block may be analyzed to determine any data dependencies in the block. If the block implements only feed-forward data flow, there is no need for temporal storage of intermediate results, and there are no accesses to shared data/operations, then multiple wavefronts may be allowed to access the protected block separated by one or more clock cycles and their results distributed accordingly. If these conditions are met, no data will be corrupted by the multiple wavefronts due to the feed-forward-only nature of the data flow. In another alternative embodiment, the protected block may be replicated sufficient times such that each accessing wavefront may use a dedicated instantiation of the hardware. If any shared data registers are accessed or modified, it may be necessary to implement the priority logic on those elements.

Wait( )/notify( ) methods

Figure 4:
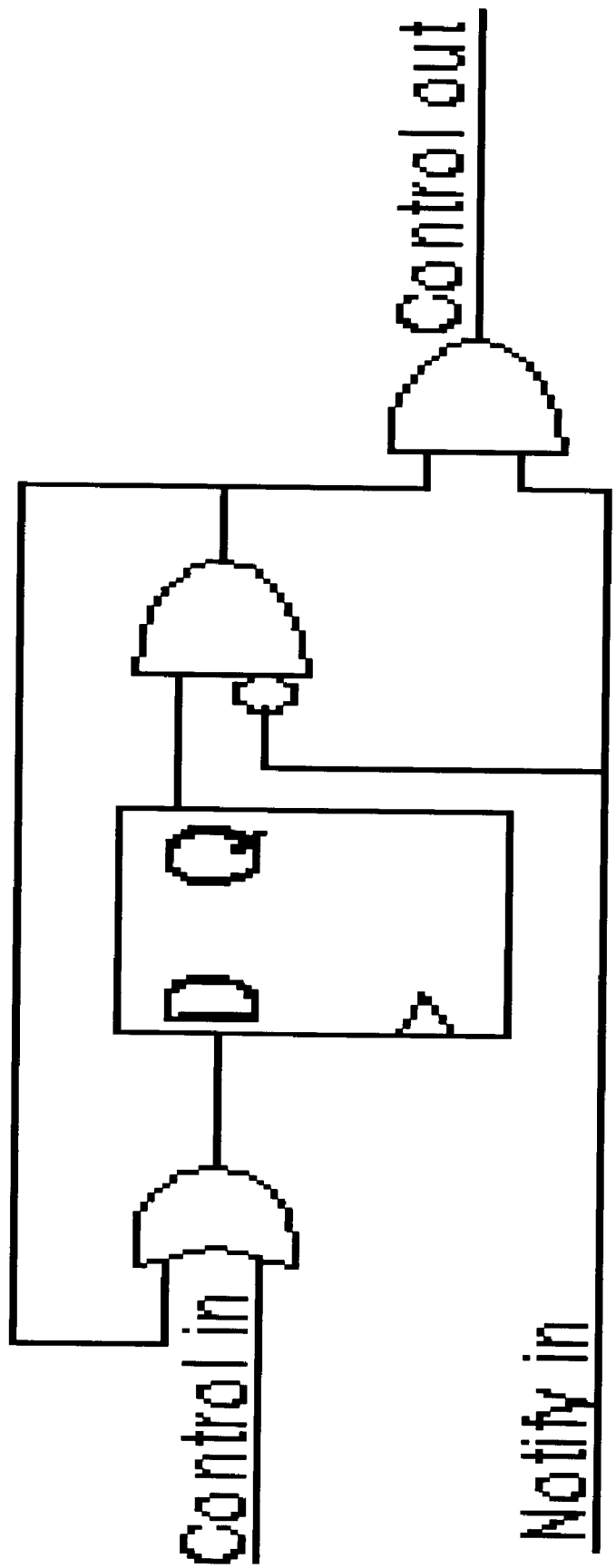
FIG. 4 shows a control-pause circuit implementation.

In the present invention, the source language is analyzed for keywords relating to inter-thread communication. For example, in the Java programming language (the source language used in the preferred embodiment), the wait( ), notify( ), and notifyAll( ) method calls are used to communicate status among two or more threads. In the source language, these methods are used to pause one thread (wait( )) until a predetermined point has been reached in another thread(notify( )). These method calls are detected in the flowgraph and are modified to implement behavior corresponding to that in the source language. In the preferred embodiment, the wait( ) method call is replaced in the flowgraph by a control pause circuit, as shown in FIG. 4.

This circuit consists of a one-bit flip-flop type register whose input derives from an AND/OR network. The OR gate captures the control entering the wait( ) method call. The AND gate drives the other input of the OR, and takes its inputs from the inverted DONE of the wait( ) method (the DONE for the wait( ) method indicates a notify( ) has been successfully received) and the output of the flip-flop. This causes the control input to the wait( ) method to become trapped in the feedback loop until the notify( ) control input is asserted, thus clearing the feedback loop and asserting the wait( ) DONE control output and allowing processing in that clock domain to continue. In an alternative embodiment, the pause circuit may include circuitry to gate the clock in this clock domain, reduce/terminate power to this clock domain, or other power saving techniques (see power management below).

In an alternative embodiment, the wait( ) method indicates that the control flow through a specific segment of the flowgraph (corresponding to that thread) is broken at the point where the wait( ) method is called. In order for processing to continue, a notify( ) call must be received by the thread. The implementation for this behavior is to break the control chain at the wait( ) method call (the control signal output of the wait( ) method is not connected to any nodes). Instead of connecting the nodes which immediately follow the wait( ) to the wait( )'s control output, they are all driven by the logical OR of all notify methods which act upon the current thread. In this manner, the notifying thread will implement a node similar to a thread branch node (where threads are created). This node has two or more control outputs that are simultaneously asserted when control is passed to that node through its own threads processing. One control output continues the processing in the current flowgraph (thread), while the other control output causes execution to continue in the thread which is holding at a wait( ) method. In the event that a thread may be notified from multiple sources, the notify control signals are all logically combined together. The notify signals are all synchronized when appropriate.

Since these pause/continue notifications are used primarily for inter-clock domain signaling, it is maintained that the synchronization circuitry described above will need to be implemented to assure the validity of the incoming continue notification.

Power management from thread sleep

One important characteristic of modern electronic devices, especially portable devices, is the ability to reduce and/or manage the power usage of these devices. There are several techniques used in achieving power savings when designing electronics hardware, which may include (but are not limited to) clock gating, power supply voltage reduction, and current limiting. These techniques may be applied to all or part of a design.

In the current invention, the source language specification is analyzed with respect to usage of the thread model. Whenever a thread is placed in an inactive state, through use of a pause/continue (wait( )/notify( )) method call or a sleep( ) method call, for example, the flowgraph is annotated with that information. When a clock domain has been annotated to indicate that it may be placed in an inactive state (due to pause or sleep), special power management circuit structures may be added. In the present embodiment, these structures may (selectively via user constraints) include:

An AND gate to mask the clock, thus eliminating edge transitions which in many technologies (CMOS for example) may cause unnecessary drain on the power supply;

A power coupling (transistor) which may be de-activated, thus eliminating power to a sub-set (that particular clock domain with the exclusion of an optional wake-up circuit) of the hardware;

Other current and/or voltage limiting circuit structures intended to limit power draw of the hardware specified in that clock domain; or Implementing any of the first 3 hardware structures on a subset of the flowgraph, thus "sleeping" only a portion of the resulting circuit.

Optimization control/metrics from thread priority

In addition to using threads to specify clock domains and power management, the present invention also analyzes the source code specification to determine the usage of thread prioritization methods. The prioritization of threads determines the relative importance and, therefore, the amount of processing allocated to a particular thread when executed in the native source code language. The preferred embodiment of this invention, detects all calls to thread priority methods when creating the flowgraph, and marks each clock domain <all nodes/paths, or at a "module" level> with the corresponding priority. This priority is used during optimization of the flowgraph to determine the relative performance metrics to be applied during the improvement process, as well as the relative weight (in terms of processing time, etc.) to be applied to optimizing each clock domain. For example, in the source code thread A has been assigned a relative priority of 10, while thread B has been assigned a relative priority of 5. Since B has the lower priority (lower means it is more important) thread B will be allocated 50% more CPU resources when optimizing. Similarly, more effort is applied during placement algorithms to ensure that the hardware corresponding to the nodes in the clock domain corresponding to thread B, are placed, relationally, closer and more optimally to encourage shorter routing, and thus more optimal hardware, even at the expense of the placement of thread A.

Thread priority annotations in the flowgraph are also factored into the resource allocation algorithms in a preferred embodiment of the invention. As the flowgraph is being analyzed, areas where arithmetic resources may be shared across multiple data flows are noted. A weighting algorithm, which includes the complexity of the circuit to be shared as well as the relative priority placed on the data flows that would be sharing the resource, is used to determine whether common arithmetic units across multiple data flows are to be merged into a single arbitrated unit or left separate. In a similar weighting scheme, data flows coded in the source specification to share a common arithmetic unit may be broken apart in such a way that each data flow has its own unique unit, thus improving overall data throughput. These techniques of resource sharing/resource duplication take into account user specifications on overall system performance (area, throughput and frequency, for example), as well as the relative priority assigned to multiple threads (if any) in the design.

The thread package analysis is also used to generate constraints for reused resources within the flowgraph (see Scheduling below). Any time a set of nodes, or flowgraph, may be accessed by multiple parallel control paths, the issue of contention arises. An access management scheme must be implemented to prevent corruption of data while waiting for access to the resource. This circuit (described in the synchronized keyword section) must implement some scheme for allowing consecutive accesses to the resource. In order to prioritize these accesses, the thread package is analyzed to discern the priority of one thread group with respect to another. Those accesses to the fixed resource that emanate from a thread group with a higher priority will be granted preferred access to the fixed resource.

Thus, from the thread model and associated keywords (throw, catch, wait, notify, synchronized, sleep), several major modifications can be made to the flowgraph. These modifications provide for power management, explicit and implicit parallelism, and data synchronization.

Object Translation to Hardware

Of increasing importance in high-level software languages is the use of and support for object-oriented programming. Object-oriented programs associate sets of related data with the methods (routines) which operate on those data (or are related to the data). This level of abstraction allows for more code reuse and better programs. An object is a combination of zero or more data fields and zero or more methods. In a traditional microprocessor environment, creation of a new object entails allocating memory space for that object to store data fields and resolving method calls to that object. Static methods and objects, as described above, are resolved into shared resources.

Objects are created through use of the new keyword. This keyword is detected in the compiled source code and, depending on further analysis of the usage of the object, may be used to create two new structures in the flowgraph. These structures create a hardware implementation that mimics object behavior found in the original source code.

The first structure created is a node to represent the memory needed for the object's data fields. In the most generalized case, this node has two functions. The first function is to indicate that a "heap" memory structure must be created in the final hardware implementation to allow for instantiation of multiple instances of this object. This heap memory is necessary whenever multiple instances of an object can be created/exist simultaneously or when object creation cannot be statically resolved (e.g., creating new objects in an unbounded loop). The second function of this structure is to manage the reading and writing of the data fields within the object. Since an object may be created (newed) anywhere, and then accessed, a circuit must be created that allows for multiple data sources to set the value in the heap memory and for multiple control paths to request one or more of the data values. This circuit takes on a structure similar to that used for managing the access by multiple threads to a synchronized method. Each data source attempting to set the value of an object data field will have a control path associated with it. All data fields are captured by the read/write circuit that manages access to that object on assertion of the associated control path. These accesses are then allowed to proceed in the order in which they were received or in another predetermined fashion. The read accesses are similarly handled. This accessor circuit is also responsible for maintaining and managing the addressing of the heap memory. In the event that multiple objects and object types all share the same heap memory, a hierarchical access scheme is employed. This is necessary due to the limited resource (data bus access to the heap memory). Each accessor circuit manages accesses to the object for which it has control. When an access is detected, the accessor circuit attempts to access the heap memory via a higher level accessor circuit (same structure as the lower level circuits), by asserting a control signal as well as providing addressing and (if a write access) data. When access is granted to the heap memory, any results and control are returned to the lower level accessor circuit, which then returns control and data to the accessing method. In an alternative embodiment, the single heap memory may be divided up into several smaller heap memories to avoid contention and thus increase the throughput of the resulting hardware implementation.

The second structure created by the newing of an object is a complete flowgraph for each method in the object or, in an alternative embodiment, for all methods accessed in any instance of that object. Because these flowgraphs are used by all calls to a method in any instance of the object being newed, only one set of these flowgraphs is created for each unique object type. Accesses to these methods are controlled by the same type of circuit that controls accesses to the shared data fields of the object.

When the lifetime (duration from creation to release) of an object can be statically determined and is limited in its scope, a performance optimization may be made to the flowgraph. When an object has limited scope and duration, the data fields can be inserted into the flowgraph as distinct nodes, as opposed to locations in a heap memory. Similarly, the nodes responsible for implementing any accessed methods within that object may inserted directly into the flowgraph; once for each instantiation of the object. This is in contrast to the general case for object instantiation, in which only one set of nodes per method is created, and the accesses to those nodes managed. This refinement is made possible by the fact that the object is guaranteed to exist, and the number of instantiations (locally) is fixed.

Exceptions

The ability to identify and handle aberrant conditions that arise during processing of the algorithm provides flexibility and robustness in the implementation of an algorithm. Java handles these situations through Exceptions. Exceptions in the source language allow for detection of an aberrant condition and the means to handle it. To create a complete mapping from the source code specification to the hardware implementation, two functions of an exception must be handled.

Capture/handling of an aberrant situation

The first function of an exception is to capture/detect the aberrant condition and to implement functionality to deal with that condition. In the source code specification of the preferred embodiment (Java), the capturing or detection of the aberration is coded by including a throw statement. The condition is detected by the designer, and a corresponding exception is thrown to indicate the error. To handle the exception in a well-defined way, one or more catch statements may be included. Each catch statement contains code for correctly handling an exception of a specific type. If none of the catch statements correctly matches the type of exception that was thrown, then the system's default exception handler takes control of the processing.

In the present invention the throw statement creates a separate control flow for indicating the error. For each throw control path, there is a corresponding data path whose value indicates the type of exception that was thrown. Each catch statement generates a sub-flowgraph (or block) that implements the algorithm specified in the source code for dealing with that type of exception. The throw control and data paths are connected to zero or more of these catch statement flowgraphs. Each catch flowgraph contains a conditional test to determine if the value of the exception matches the type of exception that it handles. If the conditional result is true, then control continues to propagate through that catch flowgraph. If the conditional result is false, then control is passed to the next catch flowgraph.

In many cases, the flowgraph generating the exception is only capable of generating one type of exception, or the type of exception that is generated may be statically determined. In these cases, the present invention does not generate the cascaded chain of exception handlers (catch statements) but instead generates flowgraph representations for only those handlers that are used. Subsequently, control flows are created directly from a throw statement to its corresponding catch flowgraph.

If an exception control flow is created and its type cannot be statically determined, a means for handling the exception in the event that no corresponding catch module is executed must also be created. This is accomplished through the Termination and Notification module. A Termination and Notification module may need to be created even when the exception type can be statically determined. The case in which the detected error condition is a fatal error is one such example.

Termination and Notification

When an exception is generated in the hardware implementation of the algorithm, one or more catch statements may be specified for handling that situation. In the case where there are either no catch statements or none of the catch statement's conditionals evaluate as true, a default handling must be provided.

In the present invention, the throw statement causes a default exception handling circuit to be added to the flowgraph. This circuit is intended to provide predictable behavior for exception handling that corresponds to the behavior expected when executing the source code specification as a software program. In the preferred embodiment, this circuit performs two functions. The first is to create a top-level signal (I/O signal) corresponding to the exception flow. This signal may be used as an "interrupt" to the system or may be otherwise routed externally to notify the system/user of the erroneous condition. The second function performed by the default exception handler circuit is to terminate all processing within the flowgraph. This corresponds to the exiting of the program running in software. Termination of processing may be accomplished by asserting the global RESET signal in the circuit or by blocking the control input to the flowgraph. The RESET signal causes all sequential elements to be returned to their initial values and all memory to be cleared. Additionally, the termination process causes all notify( ) methods to trigger exceptions in flowgraphs that are waiting on this thread.

This circuit is only one possibility of the circuitry that may be generated to handle default exceptions. In alternative embodiments, circuits may implement either interrupt generation or termination of processing. Alternatively, a myriad of other functions may be provided to handle the exception (local only reset, save state).

Through the combined use of catch modules (sub-flowgraphs) and termination/notification circuits, it is possible to correctly detect, handle, and continue processing after exception events. This allows the flowgraph representation of the algorithm (and consequently any hardware representation generated from that flowgraph) to be compliant with the original source code specification behavior.

Scheduling

A technique that is often used to minimize the amount of hardware (area/number of gates) needed to implement an algorithm is to make temporal reuse of one or more resources. This technique may include creation of "iterative" operations, like multipliers (result obtained by successive conditional adds using the same adder on multiple clock cycles) or dividers (successive conditional subtracts). This technique may also include re-use of data registers or sequences of logic, through time.

In the Java source code language, the static keyword defines methods of data fields as re-usable across all instances of the object. For example, a static data field, when accessed through any instance, points to the same memory location. A static method is one that is accessible through any instance of the object, and which only operates on static fields (if any at all).

In the present invention, the static keyword is used to identify methods and data fields that are to be temporally reused.

As the compiled source code is analyzed to assemble the initial flowgraph, methods and field variables defined as static are noted and are inserted into the flowgraph only once. Any subsequent references to a static field or method result in data and control connections being made from the referring point in the flowgraph to a particular instantiated set of nodes. In the completed flowgraph, this reuse of resources can result in contention when multiple parallel control flows attempt to access the same resource (set of nodes in the flowgraph). This condition may come about because of extracted parallelism in a flowgraph or due to multiple threads accessing the same object. In either case, the contention is resolved through instantiation of the same type of access managing circuit that was described in the thread synchronized keyword section. Each set of data sources for the method or data field is captured during the request for using the resource. These values are then supplied to the resource, in turn. When processing is complete, the results (if any) and control are fed back to the corresponding accessor.

The order in which accessors are granted use of the resource may be specified by a number of sources. The present invention uses information gathered from analysis of the source code during the thread package analysis. The thread priority information annotated to the various flowgraphs is used to determine an accessor's priority in using a fixed resource. Additional information is gathered from user constraints and default values. These may include several well-known fairness schemes (round robin, first-come first-served, etc.).

An alternative embodiment leverages user preference and constraints to provide guidance for resource reuse.

In one embodiment, the invention may be implemented in the form of program code residing on a computer-readable medium (e.g., magnetic storage, optical storage, compact disks, ROM, etc.), which program code would be executed on suitable computer equipment.

Although a number of embodiments of the invention have been described above, it is not intended that the invention be limited to those embodiments. Rather, the invention should be considered to encompass any and all configurations, modifications, variations, combinations and equivalent arrangements that may fall within the scope of the attached claims.

We claim:

1. A method of generating descriptions of digital logic from high-level language source code specifications, said method comprising the steps of:

compiling a source code specification to multiple directed graph representations, each of said representations detailing an algorithm performed by one logical section of said specification;

linking said multiple directed graph representations according to relationships defined in said source code specification, thereby obtaining a second directed graph;

compiling said second graph, comprising the steps of:
annotating said second graph by marking points where sequential hardware elements are to be inserted in a data path; and
annotating said second graph by marking points where logical processing flow feeds back upon itself with marks indicating the insertion of a sequential hardware element; and translating the resulting annotated second graph to digital hardware representation.

2. A method as set forth in claim 1, wherein:

said step of compiling a source code specification comprises the step of:

creating nodes according to functions in said source code specification; and said step of linking comprises the step of:

connecting said nodes via control paths determined according to the nodes' data dependencies and the order in which they are specified.

3. A method as set forth in claim 1, said step of compiling said second graph further comprising the step of optimizing said second graph.

4. A method as set forth in claim 3, wherein said step of optimizing comprises the step of performing logic reduction.

5. A method as set forth in claim 3, wherein said step of optimizing comprises the step of performing scheduling and resource sharing.

6. A method as set forth in claim 3, wherein said step of optimizing comprises the steps of:

annotating nodes of said second graph according to required precision of representation; and using said annotations to optimize data representations such that the shortest possible representations are used.

7. A method as set forth in claim 3, wherein said step of optimizing comprises the steps of:

performing arithmetic analysis to determine required data precision at the nodes; and using the results of said arithmetic analysis to optimize data representations such that the shortest possible representations are used.

8. A method as set forth in claim 3, wherein said step of optimization comprises the step of identifying concurrent processes and implementing them in parallel, resulting in parallel implementations of concurrent processes.

9. A method as set forth in claim 8, wherein said step of optimization further comprises the step of synchronizing said parallel implementations of concurrent processes.

10. A method as set forth in claim 9, wherein said step of synchronizing comprises the steps of:

associating a separate clock with each of said concurrent processes, thus resulting in concurrent clock domains;

identifying any data or control signals that propagate across at least two clock domains;

inserting synchronization of said data or control signals among said at least two clock domains into said second graph.

11. A method as set forth in claim 10, wherein said step of translating comprises the step of translating said inserted synchronization into double-flopped synchronization circuits.

12. A method as set forth in claim 10, wherein said step of inserting synchronization comprises the step of inserting an access control scheme for a protected block.

13. A method as set forth in claim 10, wherein said step of inserting synchronization comprises the step of inserting a synchronization scheme in which different concurrent processes signal each other when they have data or control signals ready for each other and when they are ready to accept such data or control signals.

14. A method as set forth in claim 10, wherein said step of synchronizing further comprises the step of annotating said second graph to indicate any of said concurrent processes that may enter an inactive state.

15. A method as set forth in claim 14, wherein said step of translating comprises the step of implementing power management hardware to control power to a concurrent process that may enter an inactive state.

16. A method as set forth in claim 8, wherein said step of optimization further comprises the steps of:

determining priorities of said concurrent processes; and utilizing optimization resources according to said priorities.

17. A method as set forth in claim 16, wherein said step of utilizing optimization resources comprises the steps of:

identifying areas of the flowgraph where arithmetic resources may be shared across multiple data flows;

applying a weighting algorithm that accounts for at least said priorities and the complexity of the resources that may be shared; and determining, based on said weighting algorithm, whether said arithmetic resources are to be merged into a single arbitrated resources or to be implemented separately.

18. A method as set forth in claim 17, further comprising the steps of:

identifying data flows in the flowgraph that share a common arithmetic resource;

applying said weighting algorithm; and determining, based on said weighting algorithm, whether said common arithmetic resource should be implemented as a single arithmetic resource or as a separate one for each data flow.

19. A method as set forth in claim 3, said step of optimizing comprising the step of utilizing scheduling of operations to reduce the amount of digital hardware to be generated in said step of translating.

20. A method as set forth in claim 3, said step of optimizing comprising the step of utilizing scheduling of operations to maximize the throughput of the resulting digital hardware.

21. A method as set forth in claim 1, further comprising the step of implementing exception handling capabilities found in said specification.

22. A method of generating descriptions of digital logic from high-level language source code specifications, the method comprising the steps of:

compiling a source code specification to bytecode format;

parsing said bytecode format to form multiple directed graph representations, each of said representations detailing an algorithm performed by one logical section of said specification;

linking said multiple directed graph representations according to relationships defined in said source code specification, thereby generating a second directed graph;

compiling said second graph, comprising the steps of:

annotating said second graph by marking points where sequential hardware elements are to be inserted in data path; and annotating said second graph by marking points where logical processing flow feeds back upon itself with marks indicating the insertion of a sequential hardware element; and translating the resulting annotated second graph to a digital hardware representation.

23. A method as set forth in claim 22, wherein:

said step of parsing comprises the step of:

creating nodes according to functions in said source code specification; and said step of linking comprises the step of:

connecting said nodes via control paths determined according to the nodes' data dependencies and the order in which they are specified.

24. A method as set forth in claim 22, said step of compiling said second graph further comprising the step of optimizing said second graph.

25. A method as set forth in claim 24, wherein said step of optimizing comprises the step of performing logic reduction.

26. A method as set forth in claim 24, wherein said step of optimizing comprises the step of performing scheduling and resource sharing.

27. A method as set forth in claim 24, wherein said step of optimizing comprises the steps of:

annotating nodes of said second graph according to required precision of representation; and using said annotations to optimize data representations such that the shortest possible representations are used.

28. A method as set forth in claim 24, wherein said step of optimizing comprises the steps of:

performing arithmetic analysis to determine required data precision at the nodes; and using the results of said arithmetic analysis to optimize data representations such that the shortest possible representations are used.

29. A method as set forth in claim 24, wherein said step of optimization comprises the step of identifying concurrent processes and implementing them in parallel, resulting in parallel implementations of concurrent processes.

30. A method as set forth in claim 29, wherein said step of optimization further comprises the step of synchronizing said parallel implementations of concurrent processes.

31. A method as set forth in claim 30, wherein said step of synchronizing comprises the steps of:

associating a separate clock with each of said concurrent processes, thus resulting in concurrent clock domains;

identifying any data or control signals that propagate across at least two clock domains;

inserting synchronization of said data or control signals among said at least two clock domains into said second graph.

32. A method as set forth in claim 31, wherein said step of translating comprises the step of translating said inserted synchronization into double-flopped synchronization circuits.

33. A method as set forth in claim 31, wherein said step of inserting synchronization comprises the step of inserting an access control scheme for a protected block.

34. A method as set forth in claim 31, wherein said step of inserting synchronization comprises the step of inserting a synchronization scheme in which different concurrent processes signal each other when they have data or control signals ready for each other and when they are ready to accept such data or control signals.

35. A method as set forth in claim 31, wherein said step of synchronizing further comprises the step of annotating said second graph to indicate any of said concurrent processes that may enter an inactive state.

36. A method as set forth in claim 35, wherein said step of translating comprises the step of implementing power management hardware to control power to a concurrent process that may enter an inactive state.

37. A method as set forth in claim 29, wherein said step of optimization further comprises the steps of:

determining priorities of said concurrent processes; and utilizing optimization resources according to said priorities.

38. A method as set forth in claim 37, wherein said step of utilizing optimization resources comprises the steps of:

identifying areas of the flowgraph where arithmetic resources may be shared across multiple data flows;

applying a weighting algorithm that accounts for at least said priorities and the complexity of the resources that may be shared; and determining, based on said weighting algorithm, whether said arithmetic resources are to be merged into a single arbitrated resources or to be implemented separately.

39. A method as set forth in claim 37, further comprising the steps of:

identifying data flows in the flowgraph that share a common arithmetic resource;

applying said weighting algorithm; and determining, based on said weighting algorithm, whether said common arithmetic resource should be implemented as a single arithmetic resource or as a separate one for each data flow.

40. A method as set forth in claim 24, said step of optimizing comprising the step of utilizing scheduling of operations to reduce the amount of digital hardware to be generated in said step of translating.

41. A method as set forth in claim 24, said step of optimizing comprising the step of utilizing scheduling of operations to maximize the throughput of the resulting digital hardware.

42. A method as set forth in claim 22, further comprising the step of implementing exception handling capabilities found in said specification.

43. An article of manufacture, comprising:

a computer-readable medium configured with instructions for causing a computer to generate descriptions of digital logic from high-level language source code specifications by performing the steps of, compiling a source code specification to multiple directed graph representations, each of said representations detailing an algorithm performed by one logical section of said specification;

linking said multiple directed graph representations according to relationships defined in said source code specification, thereby obtaining a second directed graph; compiling said second graph, comprising the steps of:

annotating said second graph by marking points where sequential hardware elements are to be inserted in a data path; and annotating said second graph by marking points where logical processing flow feeds back upon itself with marks indicating the insertion of a sequential hardware element; and translating the resulting annotated second graph to digital hardware representation.

44. An article of manufacture, comprising:

a computer-readable medium configured with instructions for causing a computer to generate descriptions of digital logic from high-level language source code specifications by performing the steps of, compiling a source code specification to bytecode format;

parsing said bytecode format to form multiple directed graph representations, each of said representations detailing an algorithm performed by one logical section of said specification;

linking said multiple directed graph representations according to relationships defined in said source code specification, thereby generating a second directed graph;

compiling said second graph, comprising the steps of:

annotating said second graph by marking points where sequential hardware elements are to be inserted in data path; and annotating said second graph by marking points where logical processing flow feeds back upon itself with marks indicating the insertion of a sequential hardware element; and translating the resulting annotated second graph to a digital hardware representation.

45. An apparatus for generating descriptions of digital logic from high-level language source code specifications, comprising:

means for compiling a source code specification to multiple directed graph representations, each of said representations detailing an algorithm performed by one logical section of said specification;

means for linking said multiple directed graph representations according to relationships defined in said source code specification, thereby obtaining a second directed graph;

means for compiling said second graph, comprising:

means for annotating said second graph by marking points where sequential hardware elements are to be inserted in a data path; and means for annotating said second graph by marking points where logical processing flow feeds back upon itself with marks indicating the insertion of a sequential hardware element; and means for translating the resulting annotated second graph to digital hardware representation.

* * * * *